(12) United States Patent
Kurauchi et al.

(10) Patent No.: US 12,399,223 B2
(45) Date of Patent: Aug. 26, 2025

(54) ANALYZING DEVICE, PREDICTING DEVICE, ANALYZING METHOD, PREDICTING METHOD, AND PROGRAM

(71) Applicant: Resonac Corporation, Tokyo (JP)

(72) Inventors: Yuji Kurauchi, Tokyo (JP); Shimpei Takemoto, Tokyo (JP); Yoshishige Okuno, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 18/555,121

(22) PCT Filed: Nov. 29, 2022

(86) PCT No.: PCT/JP2022/043969
§ 371 (c)(1),
(2) Date: Oct. 12, 2023

(87) PCT Pub. No.: WO2023/106166
PCT Pub. Date: Jun. 15, 2023

(65) Prior Publication Data
US 2024/0201265 A1 Jun. 20, 2024

(30) Foreign Application Priority Data
Dec. 7, 2021 (JP) .................................. 2021-198746

(51) Int. Cl.
*G01R 31/367* (2019.01)
*G01R 31/3842* (2019.01)
*G01R 31/392* (2019.01)

(52) U.S. Cl.
CPC ....... *G01R 31/367* (2019.01); *G01R 31/3842* (2019.01); *G01R 31/392* (2019.01)

(58) Field of Classification Search
None
See application file for complete search history.

(56) References Cited

U.S. PATENT DOCUMENTS

| 2019/0113577 A1* | 4/2019 | Severson | ........... G01R 31/3842 |
| 2021/0325470 A1 | 10/2021 | Patil et al. | |

FOREIGN PATENT DOCUMENTS

| JP | 2010-539473 | 12/2010 |
| JP | 2018-036131 | 3/2018 |
| JP | 2018-084549 | 5/2018 |
| JP | 6488105 | 3/2019 |
| JP | 2019-113524 | 7/2019 |
| JP | 2019-160072 | 9/2019 |
| JP | 2020-046420 | 3/2020 |
| JP | 2022-085385 | 6/2022 |

* cited by examiner

Primary Examiner — Jas A Sanghera
(74) Attorney, Agent, or Firm — IPUSA, PLLC

(57) ABSTRACT

Information related to a factor affecting a lifetime characteristic of a battery is presented. The analyzing device includes an acquiring unit configured to acquire lifetime data from cycle measurement data of a target battery, a calculating unit configured to calculate, by factoring a relationship between a voltage and a current capacity calculated from the cycle measurement data of the target battery, factor intensity transition data indicating a change in intensity of each factor affecting the current capacity and factor data indicating a relationship between a voltage and a current capacity of each factor, and an output unit configured to output the lifetime data, the factor data, and the factor intensity transition data.

10 Claims, 16 Drawing Sheets

FIG.9

FACTOR DATA MATRIX H

|  | VOLTAGE $V_1$ | ... | VOLTAGE $V_N$ |
|---|---|---|---|
| FACTOR 1 | $H_{11}$ | ... | $H_{1N}$ |
| FACTOR 2 | $H_{21}$ | ... | $H_{2N}$ |
| ... | ... | ... | ... |

×

FACTOR INTENSITY TRANSITION DATA MATRIX W

|  |  | FACTOR 1 | FACTOR 2 | ... |
|---|---|---|---|---|
| CELL 1 | CYCLE 1 | $W_{111}$ | $W_{112}$ | ... |
| | CYCLE 2 | $W_{121}$ | $W_{122}$ | ... |
| | ... | ... | ... | ... |
| CELL 2 | CYCLE 1 | $W_{211}$ | $W_{212}$ | ... |
| | CYCLE 2 | $W_{221}$ | $W_{222}$ | ... |
| | ... | ... | ... | ... |
| CELL 3 | CYCLE 1 | $W_{311}$ | $W_{312}$ | ... |
| | CYCLE 2 | $W_{321}$ | $W_{322}$ | ... |
| ... | ... | ... | ... | ... |

=

MEASUREMENT DATA MATRIX X

|  |  | VOLTAGE $V_1$ | VOLTAGE $V_2$ | ... | VOLTAGE $V_N$ |
|---|---|---|---|---|---|
| CELL 1 | CYCLE 1 | $Q_{111}$ | $Q_{112}$ | ... | $Q_{11N}$ |
| | CYCLE 2 | $Q_{121}$ | $Q_{122}$ | ... | $Q_{12N}$ |
| | ... | ... | ... | ... | ... |
| CELL 2 | CYCLE 1 | $Q_{211}$ | $Q_{212}$ | ... | $Q_{21N}$ |
| | CYCLE 2 | $Q_{221}$ | $Q_{222}$ | ... | $Q_{22N}$ |
| | ... | ... | ... | ... | ... |
| CELL 3 | CYCLE 1 | $Q_{311}$ | $Q_{312}$ | ... | $Q_{31N}$ |
| | CYCLE 2 | $Q_{321}$ | $Q_{322}$ | ... | $Q_{32N}$ |
| ... | ... | ... | ... | ... | ... |

ANALYZING DEVICE, PREDICTING DEVICE, ANALYZING METHOD, PREDICTING METHOD, AND PROGRAM

TECHNICAL FIELD

The present invention relates to an analyzing device, a predicting device, an analyzing method, a predicting method, and a program.

BACKGROUND

In the research and development of batteries, the materials and design of the batteries are evaluated by performing charge and discharge cycle tests to measure the lifetime characteristics of battery cells. Because the charge and discharge cycle test takes time, a technique of predicting the lifetime characteristic from a measurement result of a short-time charge and discharge cycle test, using a mathematical model or a machine learning technique, is used.

For example, Patent Document 1 discloses an invention for evaluating a charge and discharge tendency and a degradation state based on a QV curve or a dQ/dV curve of a battery. Patent Document 2 discloses an invention for calculating long-term characteristic prediction data by applying an artificial neural network, trained using initial characteristic training data and long-term characteristic training data, to initial characteristic measurement data of a battery. Patent Document 3 discloses an invention for predicting a lifetime from an early cycle discharge voltage curve of a battery cell, using data-driven predictive modeling.

RELATED ART DOCUMENT

Patent Document

Patent Document 1: Japanese Patent No. 6488105
Patent Document 2: Japanese National Publication of International Patent Application No. 2010-539473
Patent Document 3: Japanese Laid-open Patent Application Publication No. 2019-113524

SUMMARY

Problem to be Solved by the Invention

However, in the related art, there is a problem in that a physical phenomenon that affects a lifetime characteristic of a battery cannot be identified. Even if it is predicted that there is a problem in the lifetime characteristic, it is difficult to improve the lifetime characteristic unless a physical phenomenon affecting the lifetime characteristic can be identified.

It is an object of the present disclosure to present information related to a factor that affects a lifetime characteristic of a battery.

Means for Solving Problem

The present disclosure includes the following configurations.

[1] An analyzing device including:
an acquiring unit configured to acquire lifetime data from cycle measurement data of a target battery;
a calculating unit configured to calculate, by factoring a relationship between a voltage and a current capacity calculated from cycle measurement data of the target battery, factor intensity transition data indicating a change in intensity of each factor affecting the current capacity and factor data representing a relationship between a voltage and a current capacity of each factor; and
an output unit configured to output the lifetime data, the factor data, and the factor intensity transition data.

[2] The analyzing device as described in [1], wherein the relationship between the voltage and the current capacity is calculated based on a QV curve or a dQ/dV curve generated from the cycle measurement data.

[3] The analyzing device as described in [2], wherein the calculating unit performs the factorization by non-negative matrix factorization. [4] A predicting device including:
a calculating unit configured to calculate, by factoring a relationship between a voltage and a current capacity calculated from cycle measurement data of a target battery up to a predetermined cycle, factor intensity transition data indicating a change up to the predetermined cycle in intensity of each factor affecting the current capacity;
a generating unit configured to generate a feature from the factor intensity transition data of each factor; and
a predicting unit configured to predict a lifetime characteristic of the target battery by inputting the feature generated by the generating unit into a model that has learned a relationship between a feature of each factor and lifetime data that are generated based on cycle measurement data for training up to the predetermined cycle.

[5] The predicting device as described in [4], further comprising an output unit configured to output a prediction value of the lifetime characteristic and factor data representing a relationship between the voltage and the current capacity of a predetermined factor calculated from the cycle measurement data for training.

[6] The predicting device as described in [5], further comprising:
an acquiring unit configured to acquire a contribution state to the prediction of the lifetime characteristic of the target battery for each feature generated by the generating unit by analyzing the model; and
an identifying unit configured to extract the feature whose contribution state satisfies a predetermined condition from among the features generated by the generating unit to identify a corresponding factor,
wherein the output unit outputs the prediction value of the lifetime characteristic of the target battery, the factor data related to the identified factor, and the contribution state corresponding to the identified factor.

[7] An analyzing method performed by a computer, including:
an acquisition step of acquiring lifetime data from cycle measurement data of a target battery;
a calculation step of calculating, by factoring a relationship between a voltage and a current capacity calculated from the cycle measurement data of the target battery, factor intensity transition data indicating a change in intensity of each factor affecting the current capacity and factor data representing a relationship between a voltage and a current capacity of each factor; and
an output step of outputting the lifetime data, the factor data, and the factor intensity transition data.

[8] A predicting method performed by a computer, including:
a calculation step of calculating, by factoring a relationship between a voltage and a current capacity calculated from cycle measurement data of a target battery up to a predetermined cycle, factor intensity transition data indicating a change up to the predetermined cycle in intensity of each factor affecting the current capacity;
a generation step of generating a feature from the factor intensity transition data of each factor; and
a prediction step of predicting a lifetime characteristic of the target battery by inputting the feature generated by the generation step into a model that has learned a relationship between a feature of each factor and lifetime data that are generated based on cycle measurement data for training up to the predetermined cycle.

[9] A program for causing a computer to perform:
an acquisition step of acquiring lifetime data from cycle measurement data of a target battery;
a calculation step of calculating, by factoring a relationship between a voltage and a current capacity calculated from the cycle measurement data of the target battery, factor intensity transition data indicating a change in intensity of each factor affecting the current capacity and factor data representing a relationship between a voltage and a current capacity of each factor; and
an output step of outputting the lifetime data, the factor data, and the factor intensity transition data.

[10] A program for causing a computer to perform:
a calculation step of calculating, by factoring a relationship between a voltage and a current capacity calculated from cycle measurement data of a target battery up to a predetermined cycle, factor intensity transition data indicating a change up to the predetermined cycle in intensity of each factor affecting the current capacity;
a generation step of generating a feature from the factor intensity transition data of each factor; and
a prediction step of predicting a lifetime characteristic of the target battery by inputting the feature generated by the generation step into a model that has learned a relationship between a feature of each factor and lifetime data that are generated based on cycle measurement data for training up to the predetermined cycle.

Effect of Invention

According to the present disclosure, information related to a factor that affects a lifetime characteristic of a battery can be presented.

BRIEF DESCRIPTION OF THE DRAWINGS

FIG. 6 (B) is a diagram for explaining a method for acquiring lifetime data based on the number of charge and discharge cycles.
FIG. 7 (B) is a diagram illustrating an example of a dQ/dV curve.
FIG. 9 is a diagram for explaining non-negative matrix factorization.

DESCRIPTION OF EMBODIMENTS

In the following, embodiments of the present invention will be described with reference to the accompanying drawings. Here, in the present specification and the drawings, constituent elements having substantially the same functional configuration are denoted by the same reference symbols, and duplicated description thereof will be omitted.

First Embodiment

A first embodiment of the present invention is a battery life analyzing system that analyzes, based on cycle measurement data of a battery, a lifetime characteristic of the battery. The battery life analyzing system according to the present embodiment outputs an analysis result including lifetime data acquired from long-term cycle measurement data (hereinafter, also referred to as "cycle measurement data for analysis") of a battery to be analyzed (hereinafter, also referred to as an "analysis target battery") and information related to a factor affecting the lifetime data. Therefore, according to the battery life analyzing system in the present embodiment, when there is a problem in the lifetime characteristic of the analysis target battery, a user can easily identify a factor affecting the lifetime characteristic of the battery, and can lead to an action for improving the lifetime characteristic.

Here, the long-term cycle measurement data is cycle measurement data obtained when a charge and discharge cycle test is performed until the lifetime characteristic of the battery can actually be measured.

In order to realize the above function, the battery life analyzing system according to the present embodiment performs non-negative matrix factorization on a matrix representing the cycle measurement data, and calculates, for each factor affecting a current capacity, a factor data matrix representing a relationship between a voltage and a current capacity of the factor and a factor intensity transition data matrix representing a change in intensity of each factor as a charge and discharge cycle proceeds. Each factor data included in the factor data matrix reflects an electrochemical reaction unique to a member of the battery. Therefore, by referring to the factor data matrix and the factor intensity transition data matrix, it becomes easy to identify a factor that strongly affects the characteristic of the battery in a certain charge and discharge cycle.

<Overall Configuration of Battery Life Analyzing System>

Figure 1:
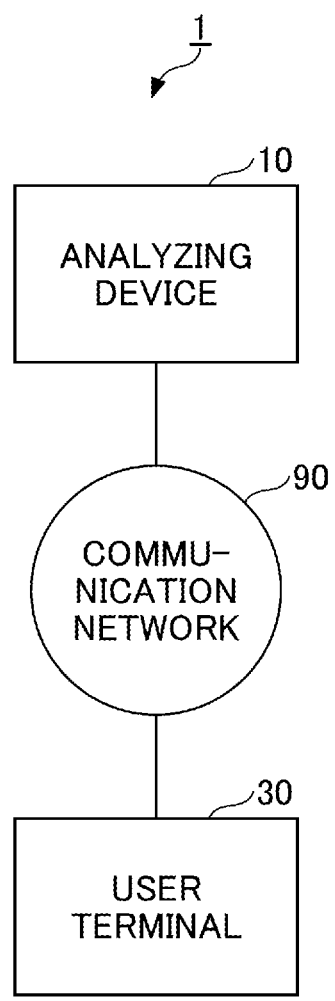
FIG. 1 is a block diagram illustrating an example of an overall configuration of a battery life analyzing system.

First, an overall configuration of the battery life analyzing system according to the present embodiment will be described with reference to FIG. 1. FIG. 1 is a block diagram illustrating an example of the overall configuration of the battery life analyzing system according to the present embodiment.

As illustrated in FIG. 1, a battery life analyzing system 1 in the present embodiment includes an analyzing device 10 and a user terminal 30. The analyzing device 10 and the user terminal 30 are connected to each other via a communication network 90 such as a local area network (LAN) or the Internet so that data communication can be performed.

The analyzing device 10 is an information processing device such as a personal computer (PC), a workstation, a server, or the like that analyzes the cycle measurement data of the battery in response to a request from the user terminal 30. The analyzing device 10 receives the cycle measurement data for analysis from the user terminal 30. Additionally, the analyzing device 10 analyzes the cycle measurement data for analysis and transmits an analysis result to the user terminal 30. The analysis result includes the lifetime characteristic of the analysis target battery and information related to a factor affecting the lifetime characteristic of the analysis target battery.

The user terminal 30 is an information processing terminal such as a PC, a tablet terminal, a smartphone, or the like operated by a user. The user terminal 30 receives an input of the cycle measurement data for analysis in response to a user's operation, and transmits the cycle measurement data for analysis to the analyzing device 10. Additionally, the user terminal 30 receives the analysis result from the analyzing device 10 and outputs the analysis result to the user.

Here, the overall configuration of the battery life analyzing system 1 illustrated in FIG. 1 is an example, and there may be various system configuration examples according to applications and purposes. For example, the analyzing device 10 may be implemented by multiple computers or may be implemented as a cloud computing service.

Additionally, for example, the battery life analyzing system 1 may be implemented by a stand-alone computer having functions that should be provided by the analyzing device 10 and the user terminal 30.

<Hardware Configuration of Battery Life Analyzing System>

Next, a hardware configuration of the battery life analyzing system 1 according to the present embodiment will be described with reference to FIG. 2.

<<Hardware Configuration of Computer>>

The analyzing device 10 and the user terminal 30 according to the present embodiment are implemented by, for example, a computer. FIG. 2 is a block diagram illustrating an example of a hardware configuration of a computer 500 according to the present embodiment.

Figure 2:
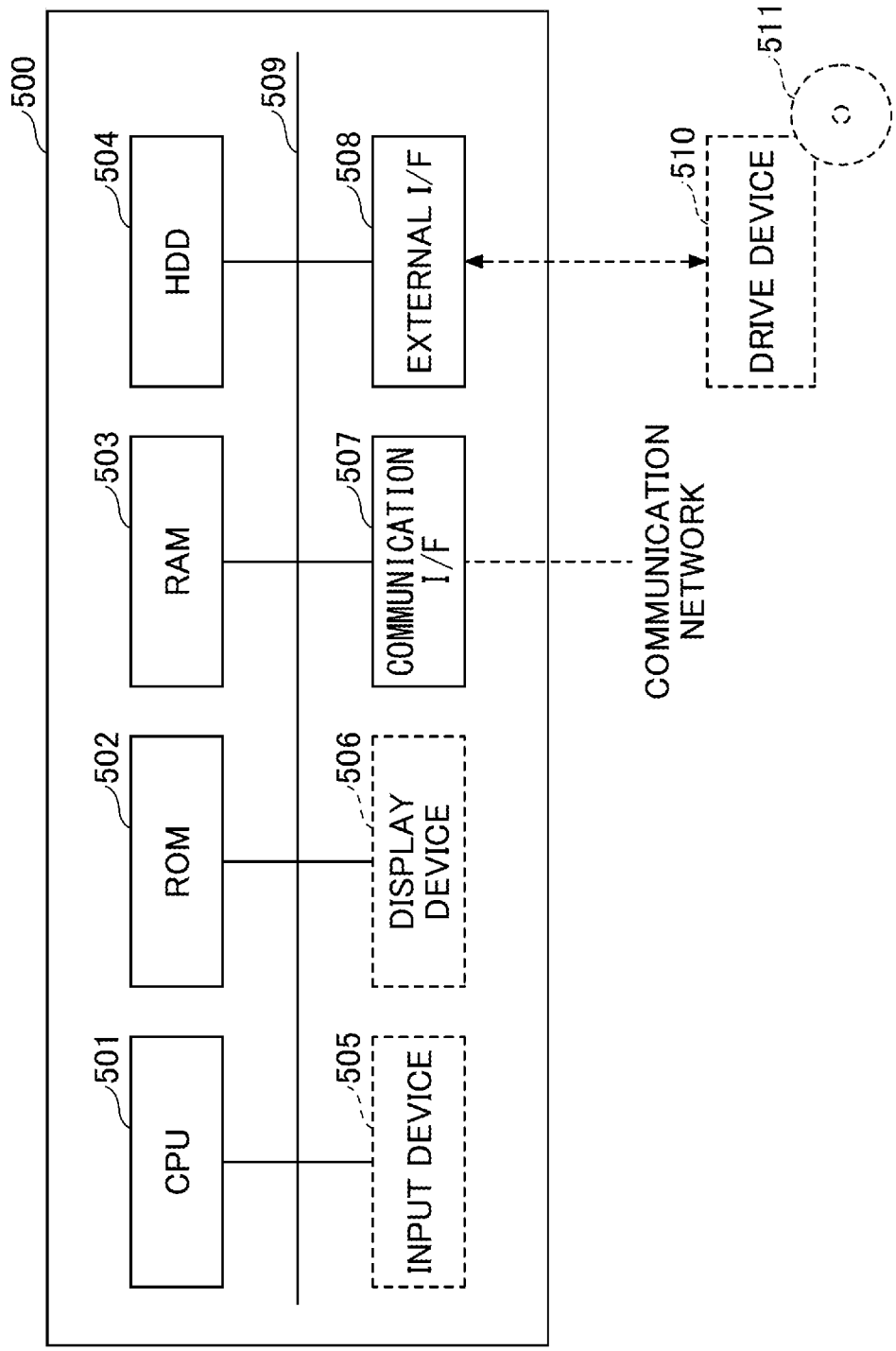
FIG. 2 is a block diagram illustrating an example of a hardware configuration of a computer.

As illustrated in FIG. 2, the computer 500 includes a central processing unit (CPU) 501, a read only memory (ROM) 502, a random access memory (RAM) 503, a hard disk drive (HDD) 504, an input device 505, a display device 506, a communication interface (I/F) 507, and an external I/F 508. The CPU 501, the ROM 502, and the RAM 503 form what is called a computer. The respective hardware components of the computer 500 are connected to each other via a bus line 509. Here, the input device 505 and the display device 506 may be configured to be used by being connected to the external I/F 508.

The CPU 501 is an arithmetic device that reads a program and data from a storage device such as the ROM 502 or the HDD 504 onto the RAM 503 and executes processing to achieve control and functions of the entire computer 500.

The ROM 502 is an example of a non-volatile semiconductor memory (a storage device) that can retain programs and data even when the power is turned off. The ROM 502 functions as a main storage device that stores various programs and data necessary for the CPU 501 to execute various programs installed in the HDD 504. Specifically, the ROM 502 stores boot programs such as a basic input/output system (BIOS) and an extensible firmware interface (EFI), which are executed when the computer 500 is started, and operating system (OS) settings and network settings.

The RAM 503 is an example of a volatile semi-conductor memory (a storage device) in which programs and data are erased when power is turned off. The RAM 503 is, for example, a dynamic random access memory (DRAM), a static random access memory (SRAM), and the like. The RAM 503 provides a work area in which the programs are loaded when various programs installed in the HDD 504 are executed by the CPU 501.

The HDD 504 is an example of a non-volatile storage device that stores programs and data. The programs and data stored in the HDD 504 include an operating system (OS), which is basic software for controlling the entire computer 500, applications that provide various functions on the OS, and the like. Here, the computer 500 may use a storage device using a flash memory (for example, a solid state drive (SSD) or the like) as a storage medium instead of the HDD 504.

The input device 505 is a touch panel used by a user to input various signals, an operation key and button, a keyboard and mouse, a microphone for inputting sound data such as voice, and the like.

The display device 506 includes a display such as a liquid crystal display or an organic electro-luminescence (EL) display that displays a screen, a speaker that outputs sound data such as voice, and the like.

The communication I/F 507 is an interface for connecting to a communication network and allowing the computer 500 to perform data communication.

The external I/F 508 is an interface with an external device. The external device includes a drive device 510 and the like.

The drive device 510 is a device for setting a recording medium 511. The recording medium 511 herein includes a medium that optically, electrically, or magnetically records information, such as a CD-ROM, a flexible disk, or a magneto-optical disk. Additionally, the recording medium 511 may include a semiconductor memory or the like that electrically records information, such as a ROM a flash memory, or the like. This allows the computer 500 to perform reading from the recording medium 511 via the external I/F 508, writing to the recording medium 511 via the external I/F 508, or both.

Here, the various programs to be installed in the HDD 504 are installed by, for example, the distributed recording medium 511 being set in the drive device 510 connected to the external I/F 508 and the drive device 510 reading the various programs recorded in the recording medium 511. Alternatively, the various programs to be installed in the HDD 504 may be installed by being downloaded from another network different from the communication network via the communication I/F 507.

<Functional Configuration of Battery Life Analyzing System>

Figure 3:
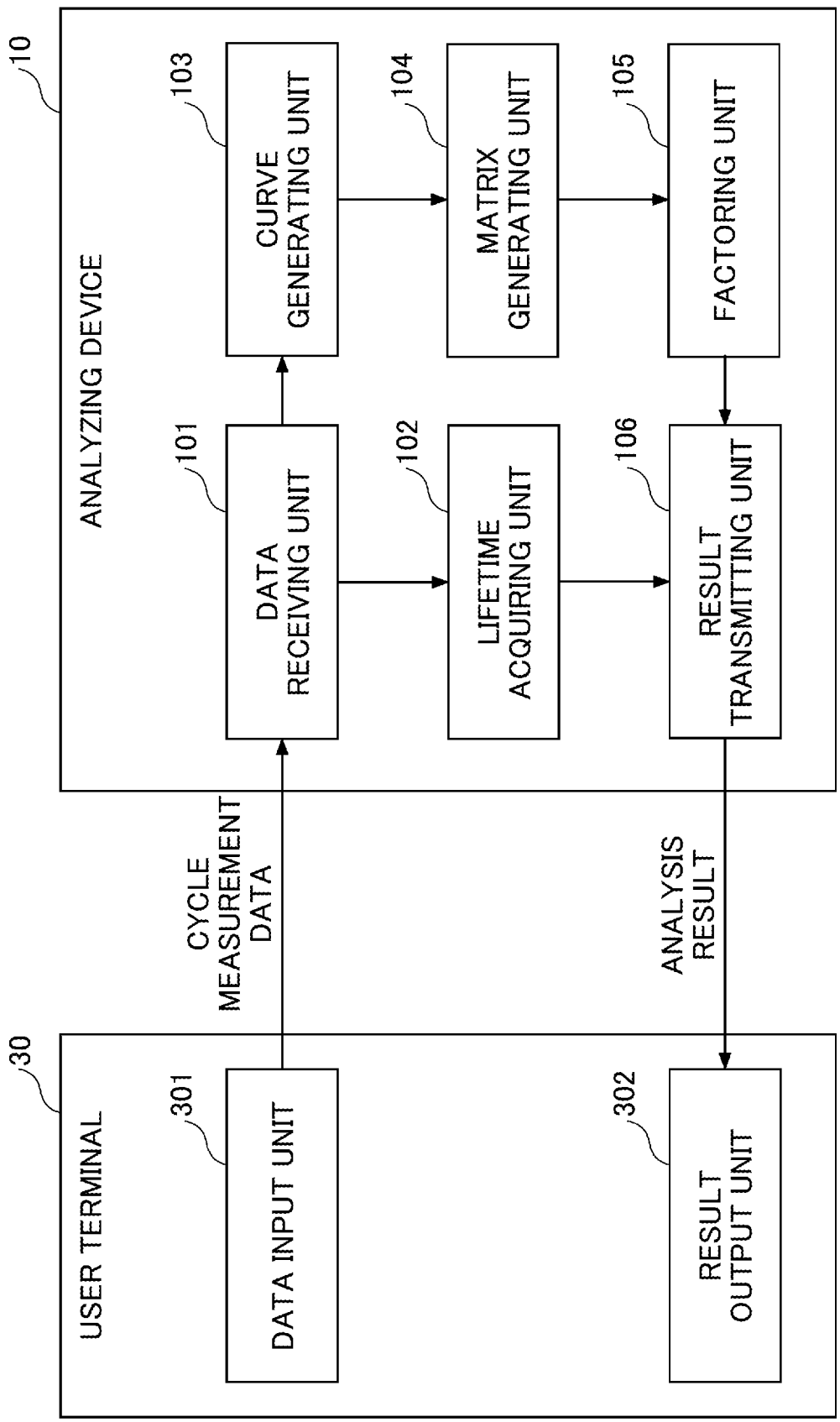
FIG. 3 is a block diagram illustrating an example of a functional configuration of the battery life analyzing system.

Subsequently, a functional configuration of the battery life analyzing system according to the present embodiment will be described with reference to FIG. 3. FIG. 3 is a block diagram illustrating an example of the functional configuration of the battery life analyzing system 1 according to the present embodiment.

<<Functional Configuration of Analyzing Device 10>>

As illustrated in FIG. 3, the analyzing device 10 according to the present embodiment includes a data receiving unit 101, a lifetime acquiring unit 102, a curve generating unit 103, a matrix generating unit 104, a factoring unit 105, and a result transmitting unit 106.

Each of the processing units included in the analyzing device 10 is realized by a process that the program, loaded from the HDD 504 to the RAM 503 illustrated in FIG. 2, causes the CPU 501 to execute.

The data receiving unit 101 receives the cycle measurement data for analysis from the user terminal 30. Additionally, the data receiving unit 101 transmits the cycle measurement data for analysis received from the user terminal 30 to the lifetime acquiring unit 102 and the curve generating unit 103.

The lifetime acquiring unit 102 acquires lifetime data representing the lifetime characteristic of the analysis target battery based on the cycle measurement data for analysis received from the data receiving unit 101. Additionally, the lifetime acquiring unit 102 transmits the acquired lifetime data to the result transmitting unit 106.

The curve generating unit 103 generates a QV curve representing a relationship between a voltage V and a current capacity Q or a dQ/dV curve obtained by differentiating the QV curve with respect to the voltage V, based on the cycle measurement data for analysis received from the data receiving unit 101. Additionally, the curve generating unit 103 transmits the generated QV curve or dQ/dV curve to the matrix generating unit 104.

The matrix generating unit 104 generates a measurement data matrix representing the relationship between the voltage and the current capacity for each charge and discharge cycle, based on the QV curve or the dQ/dV curve received from the curve generating unit 103. Additionally, the matrix generating unit 104 transmits the generated measurement data matrix to the factoring unit 105.

The factoring unit 105 performs non-negative matrix factorization on the measurement data matrix received from the matrix generating unit 104. This allows the factoring unit 105 to obtain a factor data matrix and a factor intensity transition data matrix. Additionally, the factoring unit 105 transmits a factorization result to the result transmitting unit 106. The factorization result includes the factor data matrix and the factor intensity transition data matrix.

The result transmitting unit 106 transmits an analysis result of the cycle measurement data for analysis to the user terminal 30. The analysis result includes the lifetime data received from the lifetime acquiring unit 102 and the factorization result received from the factoring unit 105.

<<Functional Configuration of User Terminal 30>>

As illustrated in FIG. 3, the user terminal 30 in the present embodiment includes a data input unit 301 and a result output unit 302.

Each of the processing units included in the user terminal 30 is realized by a process that the program, loaded from the HDD 504 to the RAM 503 illustrated in FIG. 2, causes the CPU 501 to execute.

The data input unit 301 receives an input of the cycle measurement data for analysis in response to a user's operation. Additionally, the data input unit 301 transmits the received cycle measurement data for analysis to the analyzing device 10.

The result output unit 302 receives the analysis result from the analyzing device 10. Additionally, the result output unit 302 outputs the received analysis result to the display device 506 or the like.

<Processing Procedure of Battery Life Analyzing Method>

Figure 4:
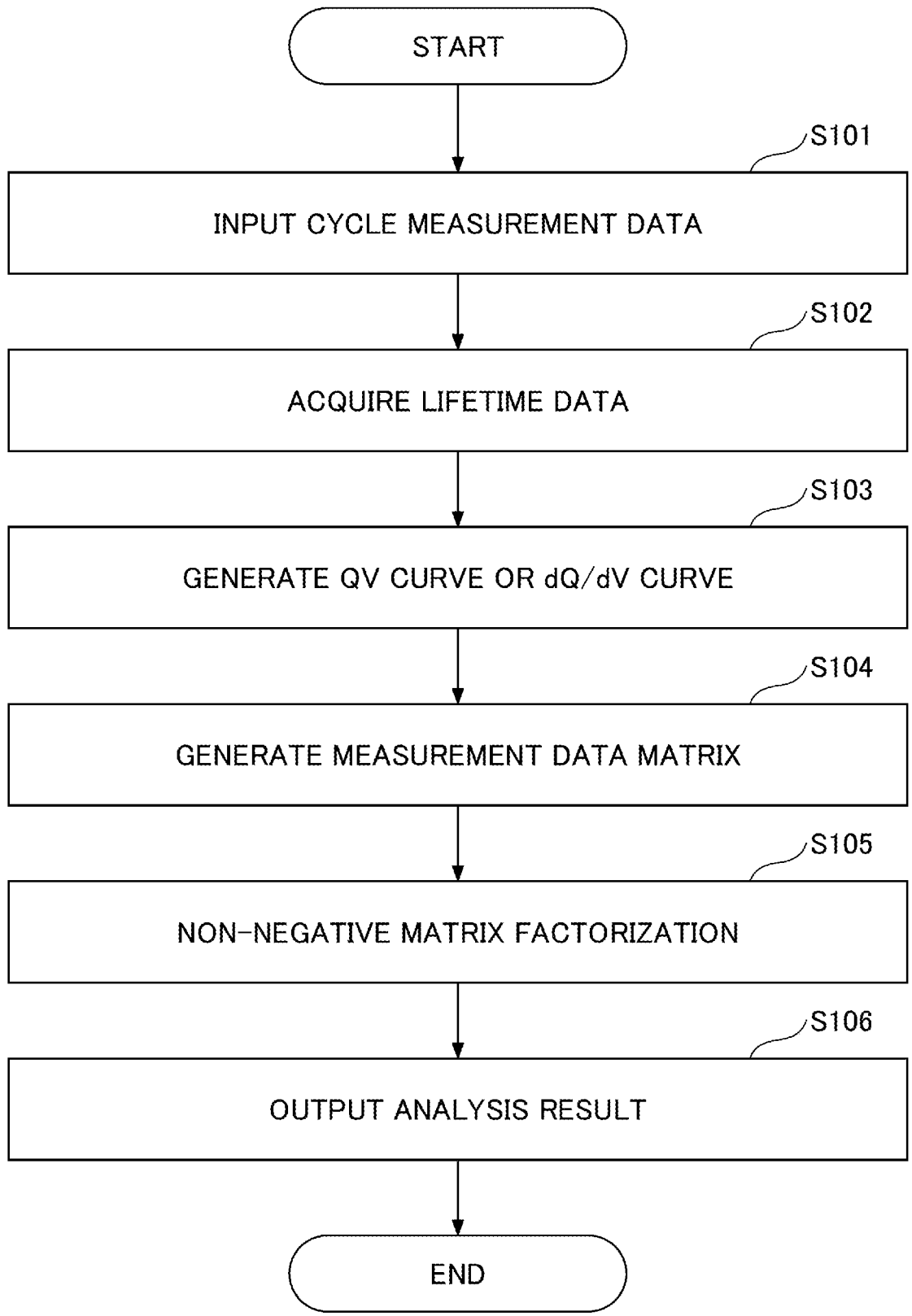
FIG. 4 is a flowchart illustrating an example of a processing procedure of a battery life analyzing method.

Next, a processing procedure of a battery life analyzing method performed by the battery life analyzing system 1 according to the present embodiment will be described. FIG. 4 is a flowchart illustrating an example of the processing procedure of the battery life analyzing method according to the present embodiment.

In step S101, the data input unit 301 included in the user terminal 30 receives the input of the cycle measurement data for analysis in response to the user's operation. Next, the data input unit 301 transmits the received cycle measurement data for analysis to the analyzing device 10.

In the analyzing device 10, the data receiving unit 101 receives the cycle measurement data for analysis from the user terminal 30. Next, the data receiving unit 101 transmits the received cycle measurement data for analysis to the lifetime acquiring unit 102 and the curve generating unit 103.

Figure 5:
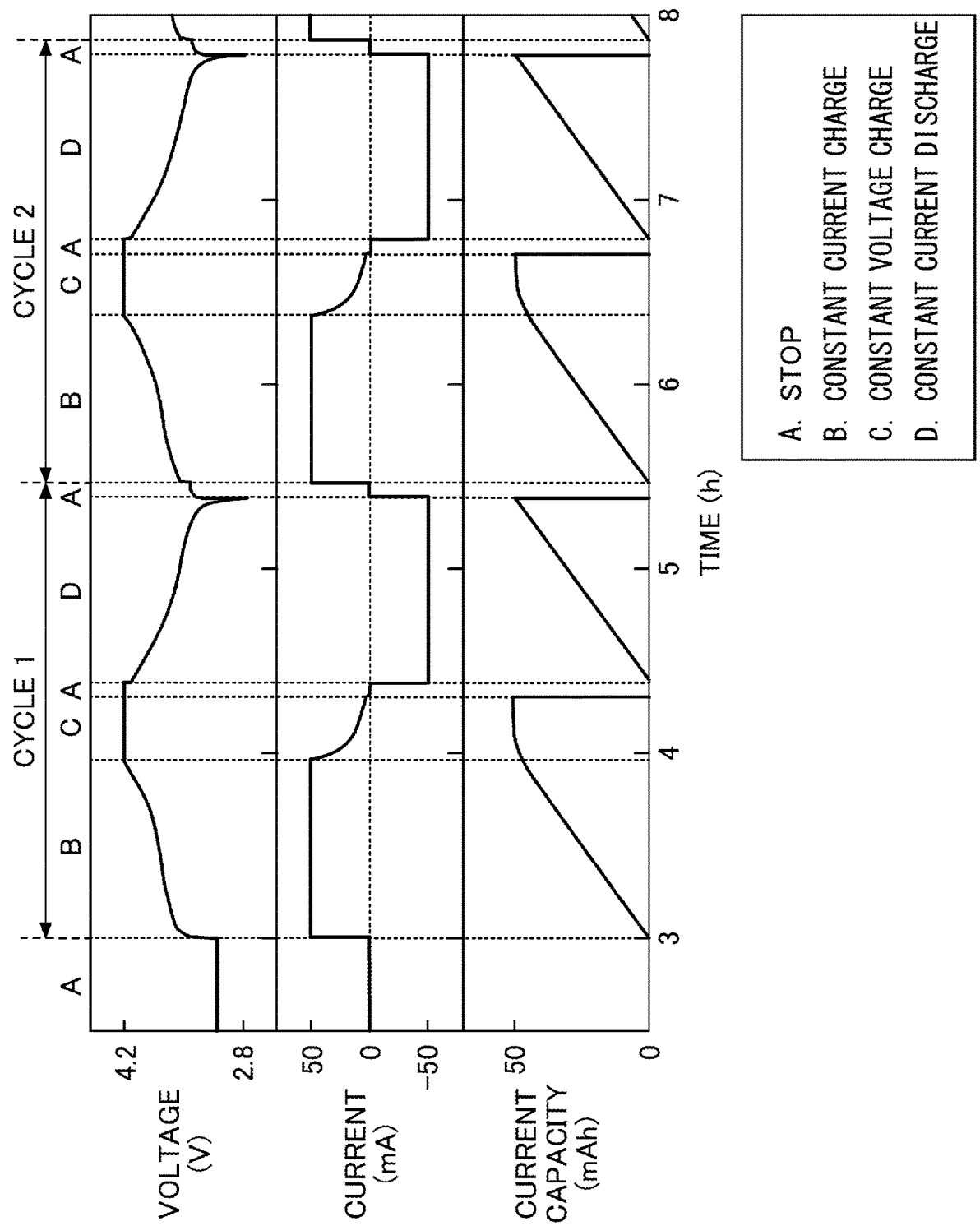
FIG. 5 is a graph illustrating an example of cycle measurement data.

Here, the cycle measurement data will be described with reference to FIG. 5. FIG. 5 is a graph illustrating an example of the cycle measurement data in the present embodiment.

The cycle measurement data is obtained by performing a charge and discharge cycle test on a single cell of the battery and recording sampling time and a physical property value of each cell at each sampling time. It is desirable that the sampling time is appropriately selected to sufficiently follow a change in the physical property value, and the sampling time need not be a constant interval. The physical property values recorded in the present embodiment include a voltage applied to a cell, a current flowing through a cell, and a current capacity.

One cycle in the charge and discharge cycle test necessarily includes a constant current charging step and a constant current discharging step after the constant current charging step. In this case, a constant voltage charging step may be included between the constant current charging step and the constant current discharging step. Additionally, a stop step may be included between the charging and discharging steps.

FIG. 5 is a graph in which data from a time before a start of a first cycle to a time after an end of a second cycle of one cell is extracted from the cycle measurement data and is plotted with time on the horizontal axis and voltage, current, and current capacity on the vertical axis. As illustrated in FIG. 5, in the charge and discharge cycle test of the present embodiment, the voltage range is from 2.8 V to 4.2 V, and the current range was from −50 mA to 50 mA.

Returning to FIG. 4, an explanation will be provided. In step S102, the lifetime acquiring unit 102 included in the analyzing device 10 receives the cycle measurement data for analysis from the data receiving unit 101. Next, the lifetime acquiring unit 102 acquires the lifetime data representing the lifetime characteristic of the analysis target battery based on the cycle measurement data for analysis. Then, the lifetime acquiring unit 102 transmits the acquired lifetime data to the result transmitting unit 106.

Figure 6:
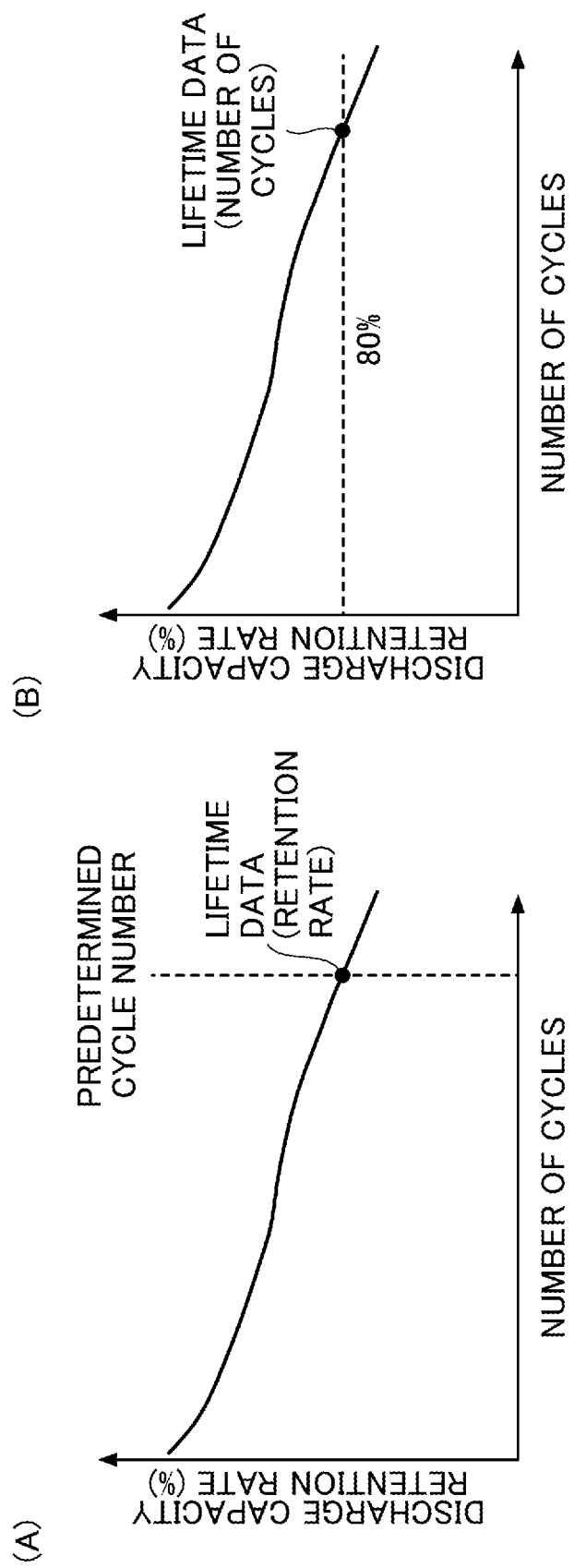
FIG. 6 (A) is a diagram for explaining a method of acquiring lifetime data based on a discharge capacity retention rate.

Here, the lifetime data will be described with reference to FIG. 6. FIG. 6 is a diagram illustrating an example of a method of acquiring the lifetime data.

As illustrated in FIG. 6, the lifetime characteristic, more specifically, the cycle capacity retention characteristic in the present embodiment is defined as the discharge capacity retention rate when predetermined charge and discharge cycles are performed (see FIG. 6 (A)) or the number of the charge and discharge cycles, i.e., the cycle lifetime when the discharge capacity retention rate is lower than a predetermined discharge capacity retention rate (see FIG. 6 (B)). Here, the discharge capacity retention rate is a rate of the discharge capacity measured at the time of performing each cycle relative to the discharge capacity measured at the first cycle.

FIG. 6 (A) and FIG. 6 (B) illustrate an example in which a lifetime characteristic of one cell is obtained. The lifetime data acquired by the lifetime acquiring unit 102 includes the lifetime characteristic acquired for each cell of the analysis target battery.

Alternatively, in the present embodiment, the curve of the discharge capacity retention rate itself may be used as the lifetime data.

Returning to FIG. 4, an explanation will be provided. In step S103, the curve generating unit 103 included in the analyzing device 10 receives the cycle measurement data for analysis from the data receiving unit 101. Next, the curve generating unit 103 generates the QV curve representing the relationship between the voltage V and the current capacity Q or the dQ/dV curve obtained by differentiating the QV curve with respect to the voltage V, based on the cycle measurement data for analysis. Then, the curve generating unit 103 transmits the generated QV curve or dQ/dV curve to the matrix generating unit 104. Here, when the internal resistance of each cell of the battery is significantly different, it is necessary to perform normalization such as subtracting the value of the IR drop from the voltage.

Figure 7:
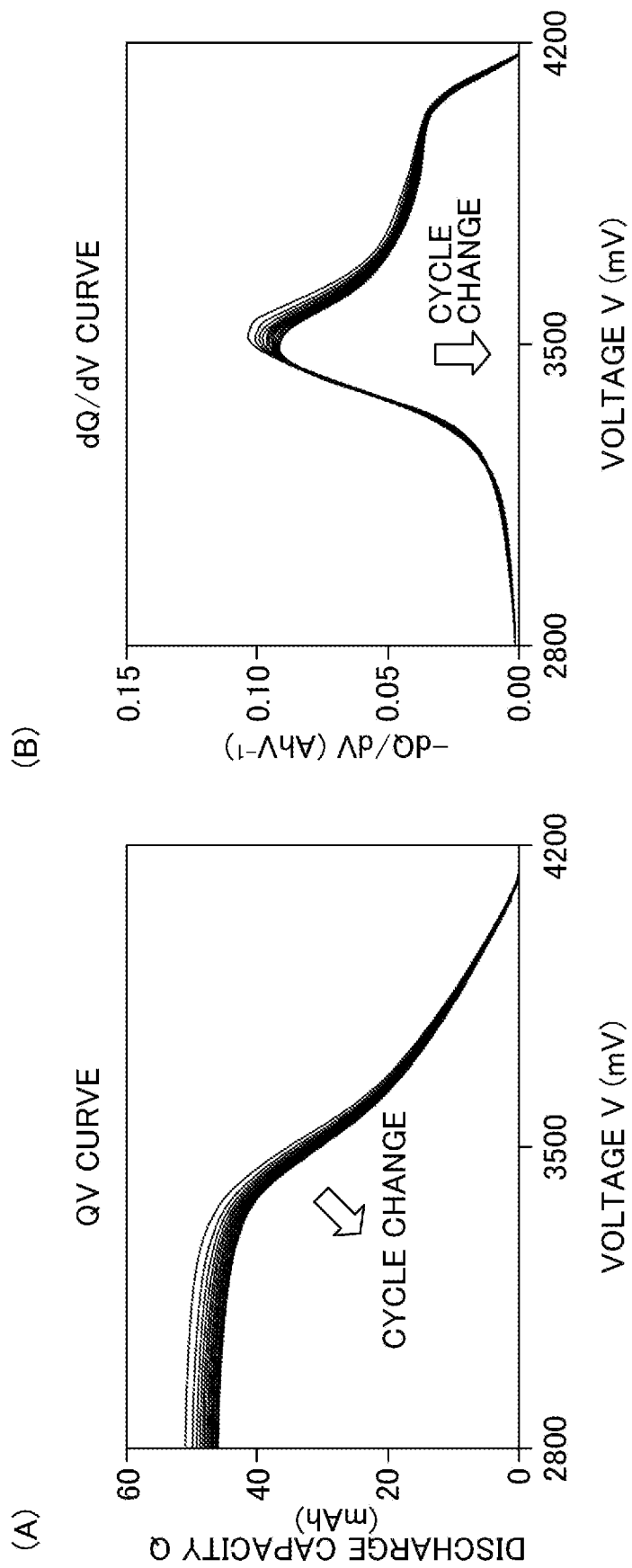
FIG. 7 (A) is a diagram illustrating an example of a QV curve.

Here, the QV curve and the dQ/dV curve will be described with reference to FIG. 7. FIG. 7 is a diagram illustrating an example of a QV curve during discharge and a dQ/dV curve during discharge. FIG. 7 (A) is an example of the QV curve, and FIG. 7 (B) is an example of the dQ/dV curve.

Each of the multiple curves illustrated in FIG. 7 corresponds to a charge/discharge cycle. As illustrated in FIG. 7, it can be found that in both the QV curve and the dQ/dV curve, the entire curve changes downward (i.e., in a direction in which the discharge capacity decreases) as the charge/discharge cycle progresses (see the arrow indicating a cycle change in each diagram).

In the QV curve and the dQ/dV curve, it is known that specific voltage ranges correspond to members of the battery (cathode and anode active materials, electrolyte additives, and the like). It is known that the QV curve and the dQ/dV curve are results obtained by superimposing patterns for respective members of the battery, and the mixing amounts of the respective patterns change as the charge and discharge cycle progresses.

Therefore, if the QV curve and the dQ/dV curve are decomposed into patterns of components corresponding to the respective members and the mixing amounts of the respective components in the respective charge and discharge cycles are found, it is useful information for identifying a member that has affected a change in the characteristic of the battery in a specific charge and discharge cycle. For example, if a discharge capacity of a certain battery rapidly decreases after a specific charge and discharge cycle, it can be assumed that there is some problem in a member whose mixing amount greatly changes around that cycle.

Returning to FIG. 4, an explanation will be provided. In step S104, the matrix generating unit 104 included in the analyzing device 10 receives the QV curve or the dQ/dV curve from the curve generating unit 103. Next, the matrix generating unit 104 generates the measurement data matrix representing the relationship between the voltage and the current capacity for each charge/discharge cycle, based on the QV curve or the dQ/dV curve. Then, the matrix generating unit 104 transmits the generated measurement data matrix to the factoring unit 105.

Figure 8:
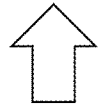
FIG. 8 is a diagram for explaining a method of generating a measurement data matrix.

Here, the measurement data matrix will be described with reference to FIG. 8. FIG. 8 is a diagram illustrating a method of generating the measurement data matrix for the QV curve during discharge.

Each table on the left side illustrated in FIG. 8 is a matrix in which the QV curve during discharge in each charge/discharge cycle for each cell of the battery is arranged with a cycle number as a row and a value of the voltage V as a column. For example, Qi in the table is a value of the discharge capacity at a cell 1, a cycle 1, and a voltage $V_1$. The voltage grids $V_1, V_2, \ldots, V_N$ described in the columns are set by the grid number N between the upper and lower limit voltage values in the cycle measurement, and normally, the grid number N is appropriately selected to sufficiently follow the change of the QV curve. When the current capacities Q in the voltage grids $V_1, V_2, \ldots, V_N$ cannot be directly obtained due to the reason of the measuring device, it is necessary to perform resampling by linear interpolation or the like. The table on the right side illustrated in FIG. 8 is a matrix in which matrices corresponding to the respective cells on the left side are stacked in the order of cell number. As a result, one matrix (the measurement data matrix) representing all cycle measurement data corresponding to respective cells of the battery is generated. Here, when the capacities of the respective cells of the battery are different, it is necessary to perform normalization such as dividing the current capacity by the design capacity at the time of stacking.

Returning to FIG. 4, an explanation will be provided. In step S105, the factoring unit 105 included in the analyzing device 10 performs non-negative matrix factorization on the measurement data matrix received from the matrix generating unit 104 to calculate the factor data matrix and the factor intensity transition data matrix. The factor data matrix represents a relationship between a voltage and a current capacity of each factor affecting the current capacity. The factor intensity transition data matrix represents a change in the intensity of each factor as the charge and discharge cycle proceeds. The intensity of each factor is the magnitude of the mixing amount of a corresponding factor with respect to the whole, and the intensity of the factor increases as the mixing amount of the factor increases. Then, the factoring unit 105 transmits a factorization result including the factor data matrix and the factor intensity transition data matrix to the result transmitting unit 106.

Here, the non-negative matrix factorization of the measurement data matrix generated from the QV curve during discharge will be described with reference to FIGS. 9 to 11. FIG. 9 is a diagram illustrating a result obtained by performing non-negative matrix factorization on the measurement data matrix illustrated in FIG. 8. Non-negative matrix factorization (NMF) is a method of approximating a non-negative matrix by a product of a non-negative basis matrix and a non-negative coefficient matrix. Here, each column of the basis matrix is also referred to as a basis vector, and each column of the coefficient matrix is also referred to as a coefficient vector.

As illustrated in FIG. 9, the measurement data matrix X can be approximated by the product of a factor data matrix H and a factor intensity transition data matrix W. The factor data matrix H corresponds to the basis matrix, and the factor intensity transition data matrix W corresponds to the coefficient matrix. That is, the matrix X representing the QV curve of the cycle M of the cell L of the battery is decomposed into the matrix W and the matrix H such that the intensity $W_{LM1}$ of the factor 1×the basis vector $H_1$ of the factor 1=($H_{11}$, $H_{12}$, . . . , $H_{1N}$)+the intensity Wine of the factor 2×the basis vector $H_2$ of the factor 2=($H_{21}$, $H_{22}$, . . . , $H_{2N}$)+ . . .

Hereinafter, the basis vectors $H_1$, $H_2$, . . . included in the factor data matrix H will be referred to as "factor data". Additionally, the coefficient vectors $W_1$, $W_2$, . . . included in the factor intensity transition data matrix W will be referred to as "factor intensity transition data". The factor data represents a relationship between a voltage and a current capacity for each member. The factor intensity transition data represents a change in the intensity of each factor data as the charge and discharge cycle proceeds.

Figure 10:
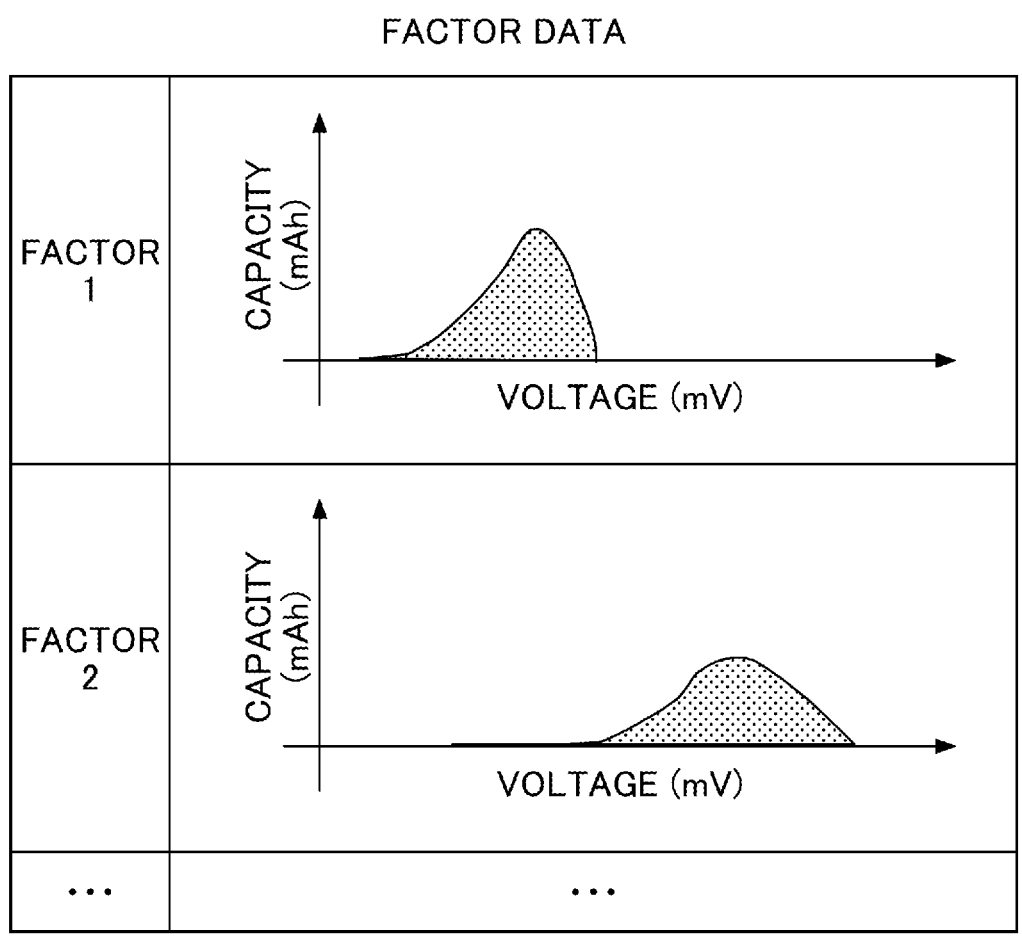
FIG. 10 is a diagram for explaining factor data.

FIG. 10 is a diagram illustrating the factor data illustrated in FIG. 9. The first row of the table illustrated in FIG. 10 is a graph in which the factor data $H_{11}$, $H_{12}$, . . . , $H_{1N}$ corresponding to the factor 1 is plotted with the voltage on the horizontal axis and the current capacity on the vertical axis. The second row of the table illustrated in FIG. 10 is a graph in which the factor data $H_{21}$, $H_{22}$, . . . , $H_{2N}$ corresponding to the factor 2 is plotted with the voltage on the horizontal axis and the current capacity on the vertical axis. As illustrated in FIG. 10, the patterns of the QV curve are different for respective factors. Because the specific voltage range is derived from the member of the battery as described above, the pattern of the factor data corresponds to the member of the battery.

Figure 11:
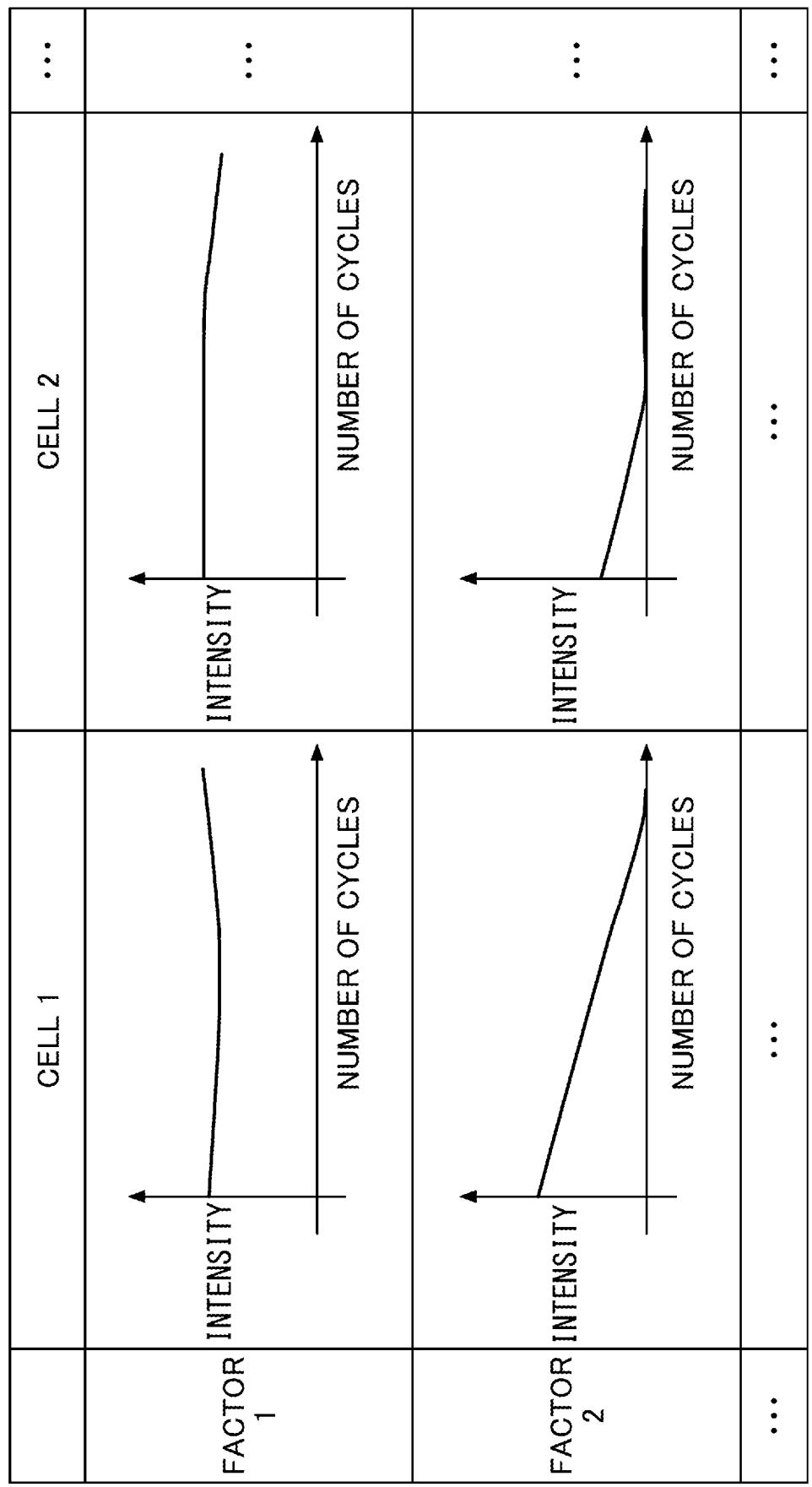
FIG. 11 is a diagram for explaining factor intensity transition data.

FIG. 11 is a diagram illustrating an example the factor intensity transition data illustrated in FIG. 9. The column of the table illustrated in FIG. 11 corresponds to each cell of the battery and the row corresponds to each factor. For example, the first column of the table illustrated in FIG. 11 represents the transition of the intensity of each factor as the charge and discharge cycle proceeds in the QV curve of the cell 1 of the battery. For example, the first row and first column of the table illustrated in FIG. 11 is a graph in which the factor intensity transition data $W_{111}$, $W_{112}$, . . . corresponding to the factor 1 of the cell 1 of the battery is plotted with the number of cycles on the horizontal axis and the intensity on the vertical axis.

According to the first column of the table illustrated in FIG. 11, it can be found that in the cell 1 of the battery, the intensity of the factor 1 does not change significantly with the progress of the charge and discharge cycle, whereas the intensity of the factor 2 decreases with the progress of the charge and discharge cycle. According to the second column of the table illustrated in FIG. 11, the same applies to the cell 2 as applied to the cell 1, but the initial intensity of the factor 2 is smaller than that of the cell 1.

The number of the factors in the non-negative matrix factorization must be minimized while sufficiently reducing error in approximating the measurement data matrix X by the product of the factor data matrix H and the factor intensity transition data matrix W. As a method of determining the optimal number of the factors, for example, Bayesian information criterion, Akaike's information criterion, Malinowski IND function, or maximum likelihood estimation can be used.

The processing procedure from step S104 to step S105 with respect to the QV curve during discharging has been described above. With respect to the QV curve during charging and the do/dV curve during charging or discharging, substantially the same processing can be performed by appropriately reading the above description and FIGS. 8 to 10.

Returning to FIG. 4, an explanation will be provided. In step S106, the result transmitting unit 106 included in the analyzing device 10 receives the lifetime data from the lifetime acquiring unit 102. Additionally, the result transmitting unit 106 receives the factorization result from the factoring unit 105. Then, the result transmitting unit 106 transmits the analysis result including the lifetime data and the factorization result to the user terminal 30.

In the user terminal 30, the result output unit 302 receives the analysis result from the analyzing device 10. Then, the result output unit 302 outputs the received analysis result to the display device 506 or the like.

Effects of First Embodiment

The battery life analyzing system 1 according to the present embodiment analyzes the cycle measurement data of the battery and outputs the analysis result to the user. The analysis result includes the lifetime characteristic of the battery and the information related to the factor affecting the lifetime characteristic of the battery.

Therefore, according to the battery life analyzing system 1 in the present embodiment, when there is a problem in the lifetime characteristic of the battery, the user can easily identify a member that affects the lifetime characteristic, and can lead to an action for improving the lifetime characteristic.

Second Embodiment

A second embodiment of the present invention is a battery life predicting system that predicts, based on cycle measurement data of a battery, a lifetime characteristic of the battery. The battery life predicting system in the present embodiment trains a prediction model using long-term cycle measurement data (hereinafter also referred to as "cycle measurement data for training") of a battery regarded as a training target (hereinafter also referred to as a "training target battery") and predicts, from initial cycle measurement data (hereinafter also referred to as "cycle measurement data for prediction") of the battery regarded as a prediction target (hereinafter also referred to as a "prediction target battery"), a lifetime characteristic of the prediction target battery, using the prediction model. At this time, the battery life predicting system outputs, to the user, information related to a factor affecting the lifetime characteristic of the battery, together with a prediction value of the lifetime characteristic of the prediction target battery. Therefore, when it is predicted that there is a problem in the lifetime characteristic of the prediction target battery, the user can easily identify a factor that affects the lifetime characteristic of the battery, and can lead to an action for improving the lifetime characteristic.

Here, the initial cycle measurement data is cycle measurement data obtained when the charge and discharge cycle test is performed from a start to a predetermined prediction execution cycle number. The prediction execution cycle number may be any number as long as the prediction execution cycle number is shorter than the expected cycle lifetime, and may be set to, for example, 100 cycles or the like.

<Overall Configuration of Battery Life Predicting System>

Figure 12:
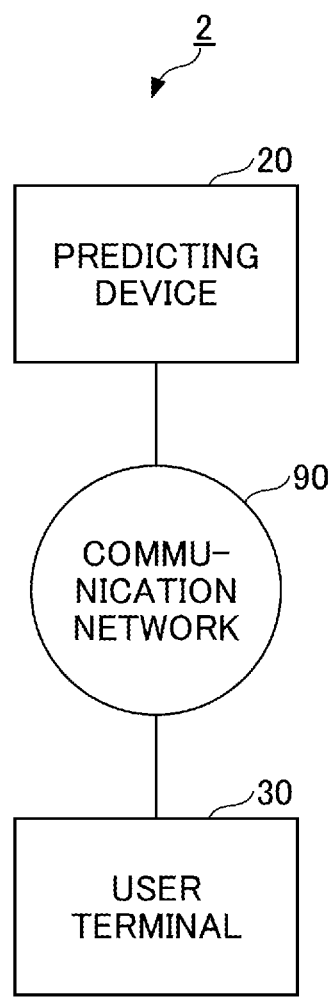
FIG. 12 is a block diagram illustrating an example of an overall configuration of a battery life predicting system.

First, an overall configuration of the battery life predicting system according to the present embodiment will be described with reference to FIG. 12. FIG. 12 is a block diagram illustrating an example of the overall configuration of the battery life predicting system according to the present embodiment.

As illustrated in FIG. 12, a battery life predicting system 2 in the present embodiment includes a predicting device 20 and the user terminal 30. The predicting device 20 and the user terminal 30 are connected to each other via the communication network 90 such as a local area network (LAN) or the Internet so that data communication can be performed.

The predicting device 20 is an information processing device such as a personal computer (PC), a workstation, a server, or the like that predicts the lifetime characteristic of the battery in response to a request from the user terminal 30. The predicting device 20 receives the cycle measurement data for training and the cycle measurement data for prediction from the user terminal 30. Additionally, the predicting device 20 trains a prediction model for predicting the lifetime characteristic of the battery based on the cycle measurement data for training. Then, the predicting device 20 predicts the lifetime characteristics from the cycle measurement data for prediction, using the prediction model, and transmits a prediction result to the user terminal 30. The prediction result includes a prediction value of the lifetime characteristic of the prediction target battery and information related to the factor affecting the lifetime characteristic of the battery.

The user terminal 30 is an information processing terminal such as a PC, a tablet terminal, a smartphone, or the like operated by a user. The user terminal 30 receives an input of the cycle measurement data for training and the cycle measurement data for prediction in response to a user's operation, and transmits the cycle measurement data for training and the cycle measurement data for prediction to the predicting device 20. Additionally, the user terminal 30 receives a prediction result from the predicting device 20 and outputs the prediction result to the user.

Here, the overall configuration of the battery life predicting system 2 illustrated in FIG. 12 is an example, and there may be various system configuration examples according to applications and purposes. For example, the predicting device 20 may be implemented by multiple computers or may be implemented as a service of cloud computing. Additionally, for example, the predicting device 20 and the user terminal 30 may be implemented by a stand-alone computer having functions that should be provided by the predicting device 20 and the user terminal 30.

<Hardware Configuration of Battery Life Predicting System>

Next, a hardware configuration of the battery life predicting system 2 according to the present embodiment will be described. The predicting device 20 and the user terminal 30 according to the present embodiment are implemented by, for example, the computer 500 as illustrated in FIG. 2.

<Functional Configuration of Battery Life Predicting System>

Figure 13:
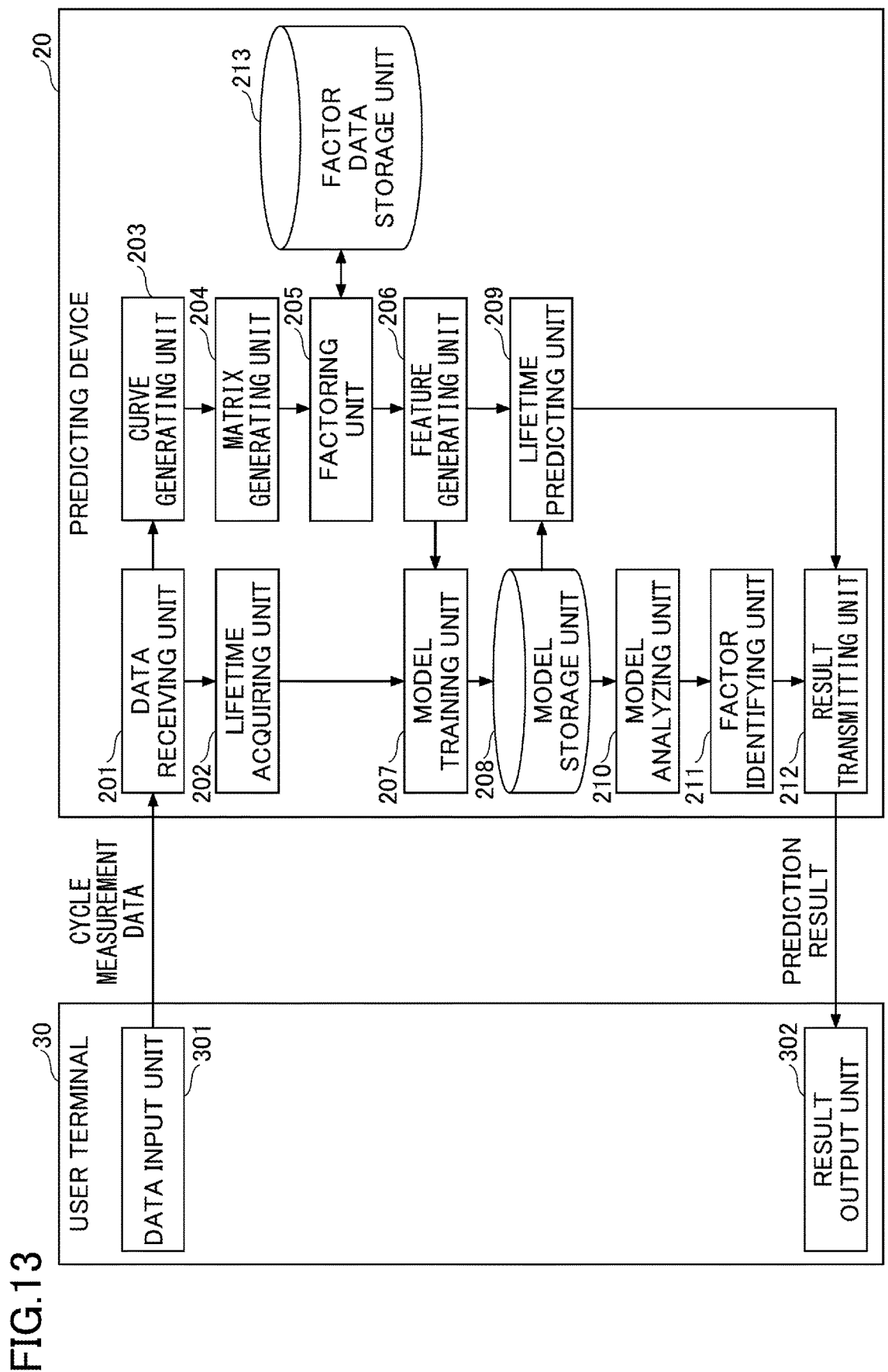
FIG. 13 is a block diagram illustrating an example of a functional configuration of the battery life predicting system.

Next, a functional configuration of the battery life predicting system according to the present embodiment will be described with reference to FIG. 13. FIG. 13 is a block diagram illustrating an example of the functional configuration of the battery life predicting system 2 according to the present embodiment.

<<Functional Configuration of Predicting Device 20>>

As illustrated in FIG. 13, the predicting device 20 according to the present embodiment includes a data receiving unit 201, a lifetime acquiring unit 202, a curve generating unit 203, a matrix generating unit 204, a factoring unit 205, a feature generating unit 206, a model training unit 207, a model storage unit 208, a lifetime predicting unit 209, a model analyzing unit 210, a factor identifying unit 211, a result transmitting unit 212, and a factor data storage unit 213.

Each of the processing units (except for the model storage unit 208 and the factor data storage unit 213) included in the predicting device 20 is implemented by a process that a program loaded from the HDD 504 to the RAM 503 illustrated in FIG. 2 causes the CPU 501 to execute.

The model storage unit 208 and the factor data storage unit 213 included in the predicting device 20 are implemented using, for example, the HDD 504 illustrated in FIG. 2.

The data receiving unit 201 receives the cycle measurement data for training and the cycle measurement data for prediction from the user terminal 30. Additionally, the data receiving unit 201 transmits the received cycle measurement data for training to the lifetime acquiring unit 202 and the curve generating unit 203. Further, the data receiving unit 201 transmits the received cycle measurement data for prediction to the curve generating unit 203.

The lifetime acquiring unit 202 acquires the lifetime data representing the lifetime characteristic of the battery based on the cycle measurement data for training received from the data receiving unit 201. Additionally, the lifetime acquiring unit 202 transmits the acquired lifetime data to the model training unit 207.

The curve generating unit 203 generates a QV curve or a dQ/dV curve based on the cycle measurement data for training received from the data receiving unit 201. Additionally, the curve generating unit 203 generates a QV curve or a dQ/dV curve based on the cycle measurement data for prediction received from the data receiving unit 201. Further, the curve generating unit 203 transmits the generated QV curves or dQ/dV curves to the matrix generating unit 204.

The matrix generating unit 204 generates a measurement data matrix representing the relationship between the voltage and the current capacity for each charge and discharge cycle based on the QV curve or the dQ/dV curve received from the curve generating unit 203. Additionally, the matrix generating unit 204 transmits the generated measurement data matrix to the factoring unit 205.

The factoring unit 205 performs non-negative matrix factorization on the measurement data matrix received from the matrix generating unit 204. This allows the factoring unit 205 to obtain a factor data matrix and a factor intensity transition data matrix. When the non-negative matrix factorization is performed on the cycle measurement data for training, the factoring unit 205 stores the factor data matrix in the factor data storage unit 213. When the non-negative matrix factorization is to be performed on the cycle measurement data for prediction, the factoring unit 205 uses the factor data matrix stored in the factor data storage unit 213 as the factor data matrix, and generates the factor intensity transition data matrix by multiplying the measurement data matrix by an inverse matrix of the stored factor data matrix. Further, in either case, the factoring unit 205 transmits a factorization result to the feature generating unit 206 and the result transmitting unit 212. The factorization result includes the factor data matrix and the factor intensity transition data matrix.

The factor data storage unit 213 stores the factor data matrix generated by the factoring unit 205 based on the cycle measurement data for training.

The feature generating unit 206 extracts a predetermined feature from the factor intensity transition data matrix received from the factoring unit 205. When the feature is extracted from the factor intensity transition data matrix based on the cycle measurement data for training, the feature generating unit 206 transmits the extracted feature to the model training unit 207. When the feature is extracted from the factor intensity transition data matrix based on the cycle measurement data for prediction, the feature generating unit 206 transmits the extracted feature to the lifetime predicting unit 209.

The model training unit 207 adds the lifetime data received from the lifetime acquiring unit 202 to the feature received from the feature generating unit 206. This allows the model training unit 207 to generate training data. Additionally, the model training unit 207 trains a prediction model, in which the feature is an explanatory variable and the lifetime data is an objective variable, using the generated training data. Further, the model training unit 207 stores the trained prediction model in the model storage unit 208.

The model storage unit 208 stores the prediction model that has learned the relationship between the feature and the lifetime data and that is generated by the model training unit 207 based on the cycle measurement data.

The lifetime predicting unit 209 calls the prediction model stored in the model storage unit 208 and inputs the feature received from the feature generating unit 206 into the prediction model. This allows the lifetime predicting unit 209 to predict the lifetime characteristic of the prediction target battery. Additionally, the lifetime predicting unit 209 transmits a prediction value of the lifetime characteristic to the result transmitting unit 212.

The model analyzing unit 210 analyzes the prediction model stored in the model storage unit 208, and obtains a contribution state to the prediction of the lifetime characteristic for each feature. Additionally, the model analyzing unit 210 transmits contribution state information to the factor identifying unit 211. The contribution state information includes a contribution state related to each feature.

The factor identifying unit 211 extracts a feature whose contribution state satisfies a predetermined condition based on the contribution state information received from the model analyzing unit 210. Additionally, the factor identifying unit 211 identifies a factor corresponding to the extracted feature. Further, the factor identifying unit 211 transmits important factor information to the result transmitting unit 212. The important factor information includes factor data corresponding to the identified factor and a contribution state of a feature corresponding to the factor.

The result transmitting unit 212 transmits a prediction result of the lifetime characteristic of the prediction target battery to the user terminal 30. The prediction result includes the prediction value of the lifetime characteristic received from the lifetime predicting unit 209 and the important factor information received from the factor identifying unit 211.

<<Functional Configuration of User Terminal 30>>

As illustrated in FIG. 13, the user terminal 30 in the present embodiment includes a data input unit 301 and a result output unit 302.

The data input unit 301 receives inputs of the cycle measurement data for training and the cycle measurement data for prediction in response to a user's operation. Additionally, the data input unit 301 transmits the received cycle measurement data for training and cycle measurement data for prediction to the predicting device 20.

The result output unit 302 receives the prediction result from the predicting device 20. Additionally, the result output unit 302 outputs the received prediction result to the display device 506 or the like.

<Processing Procedure of Battery Life Predicting Method>

Next, a processing procedure of a battery life predicting method performed by the battery life predicting system 2 in the present embodiment will be described. The battery life predicting method according to the present embodiment includes a prediction model training process and a lifetime characteristic predicting process.

<<Prediction Model Training Process>>

Figure 14:
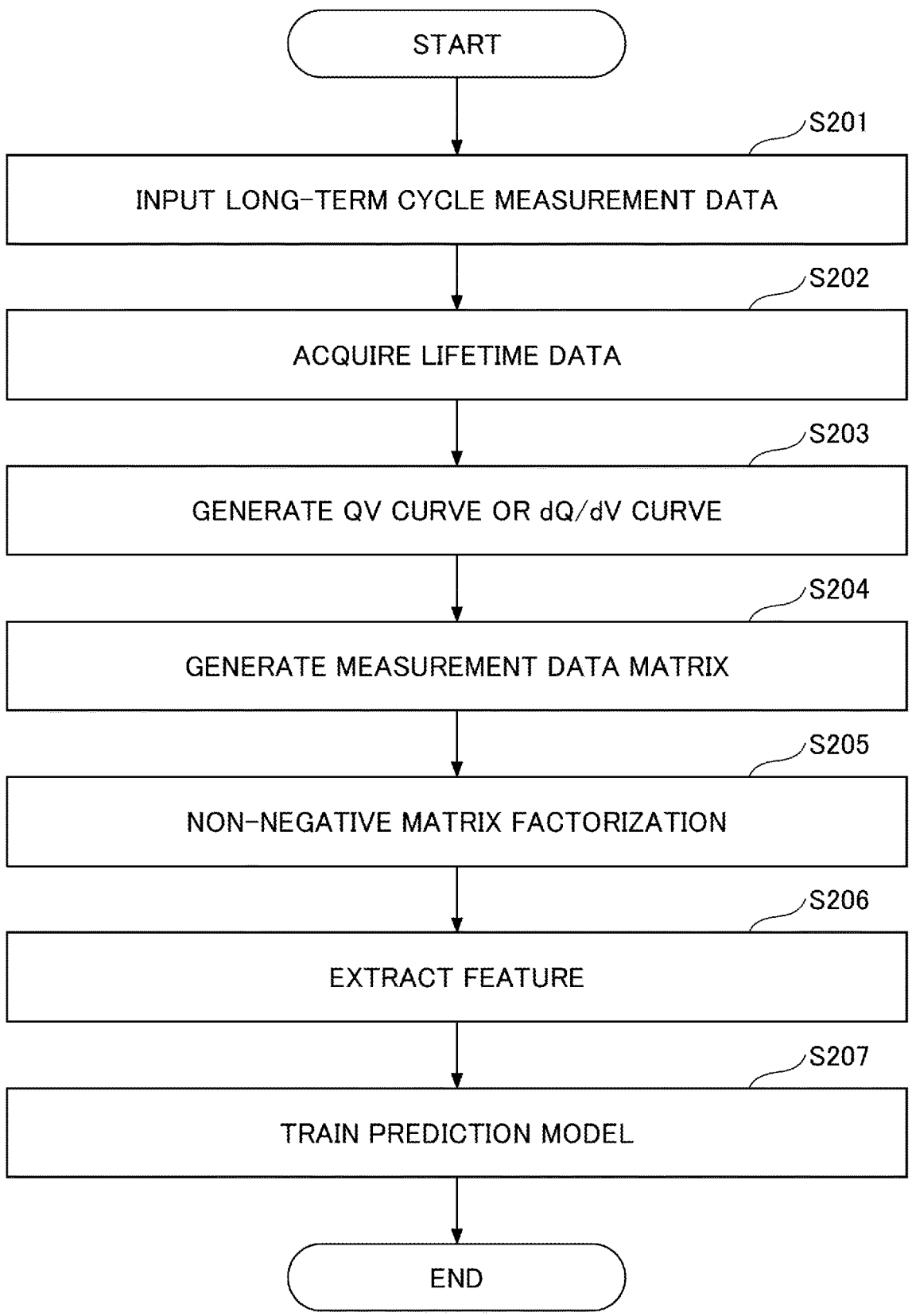
FIG. 14 is a flowchart illustrating an example of a processing procedure of a prediction model learning process.

FIG. 14 is a flowchart illustrating an example of the processing procedure of the prediction model training process according to the present embodiment.

In step S201, the data input unit 301 included in the user terminal 30 receives an input of the cycle measurement data for training according to a user's operation. Next, the data input unit 301 transmits the received cycle measurement data for training to the predicting device 20.

In the predicting device 20, the data receiving unit 201 receives the cycle measurement data for training from the user terminal 30. Next, the data receiving unit 201 transmits the received cycle measurement data for training to the lifetime acquiring unit 202 and the curve generating unit 203.

In step S202, the lifetime acquiring unit 202 included in the predicting device 20 receives the cycle measurement data for training from the data receiving unit 201. Next, the lifetime acquiring unit 202 acquires the lifetime data representing the lifetime characteristic of the training target battery based on the cycle measurement data for training. Then, the lifetime acquiring unit 202 transmits the acquired lifetime data to the model training unit 207.

In step S203, the curve generating unit 203 included in the predicting device 20 receives the cycle measurement data for training from the data receiving unit 201. Next, the curve generating unit 203 generates a QV curve or a dQ/dV curve based on the cycle measurement data for training. Then, the curve generating unit 203 transmits the generated QV curve or dQd/dV curve to the matrix generating unit 204.

In step S204, the matrix generating unit 204 included in the predicting device 20 receives the QV curve or the dQ/dV curve from the curve generating unit 203. Next, the matrix generating unit 204 generates the measurement data matrix based on the QV curve or the dQ/dV curve. Then, the matrix generating unit 204 transmits the generated measurement data matrix to the factoring unit 205.

In step S205, the factoring unit 205 included in the predicting device 20 performs non-negative matrix factorization on the measurement-data matrix received from the matrix generating unit 204 to calculate a factor data matrix and a factor intensity transition data matrix. Next, the factoring unit 205 stores the factor data matrix in the factor data storage unit 213. Then, the factoring unit 205 transmits a factorization result including the factor data matrix and the factor intensity transition data matrix to the feature generating unit 206.

In step S206, the feature generating unit 206 included in the predicting device 20 receives the factorization result from the factoring unit 205. Next, the feature generating unit 206 extracts the predetermined feature from the factor intensity transition data matrix included in the factorization result. Then, the feature generating unit 206 transmits the extracted feature to the model training unit 207.

The feature generating unit 206 extracts the feature from the factor intensity transition data up to a predetermined prediction execution cycle number. The feature is a final intensity, a final slope, or the like when the factor intensity transition data obtained up to the prediction execution cycle number is plotted on a graph as illustrated in FIG. 11. The feature includes a feature corresponding to each cell of the training target battery.

In step S207, the model training unit 207 included in the predicting device 20 receives the feature from the feature generating unit 206. Additionally, the model training unit 207 receives the lifetime data from the lifetime acquiring unit 202. Next, the model training unit 207 generates the training data by adding the lifetime data to the feature. Subsequently, the model training unit 207 trains the prediction model, in which the feature is an explanatory variable and the lifetime data is an objective variable, using the generated training data. Then, the model training unit 207 stores the trained prediction model in the model storage unit 208.

<<Lifetime Characteristic Predicting Process>>

Figure 15:
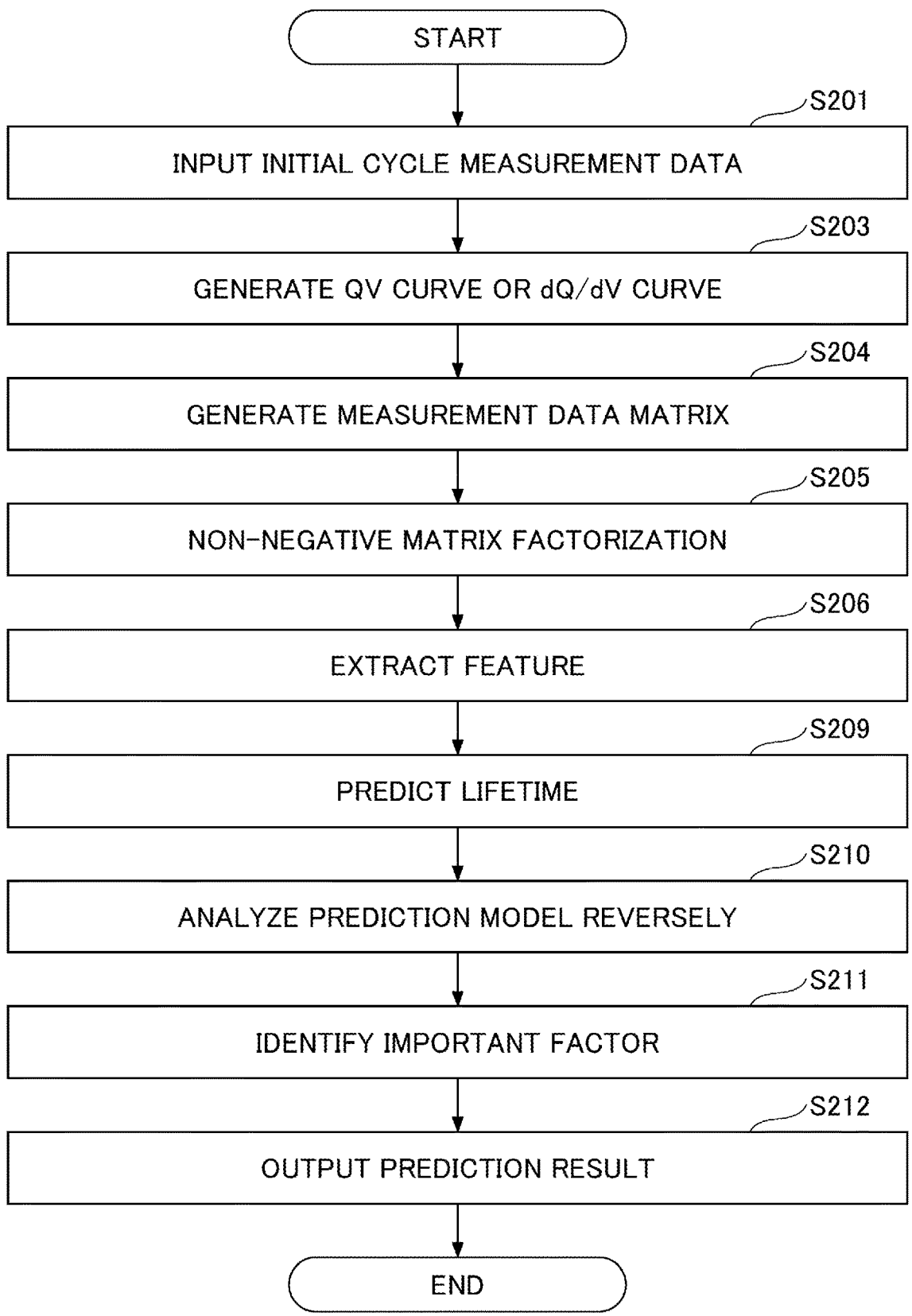
FIG. 15 is a flowchart illustrating an example of a processing procedure of a lifetime characteristic predicting process.

FIG. 15 is a flowchart illustrating an example of a processing procedure of a lifetime characteristic predicting process according to the present embodiment.

In step S201, the data input unit 301 included in the user terminal 30 receives an input of the cycle measurement data for prediction in response to a user's operation. Next, the data input unit 301 transmits the received cycle measurement data for prediction to the predicting device 20.

In the predicting device 20, the data receiving unit 201 receives the cycle measurement data for prediction from the user terminal 30. Next, the data receiving unit 201 transmits the received cycle measurement data for prediction to the curve generating unit 203.

The processing in steps S203 and S204 is substantially the same as the prediction model training process.

In step S205, the factoring unit 205 included in the predicting device 20 performs the non-negative matrix factorization on the measurement data matrix received from the matrix generating unit 204 to calculate the factor data matrix and the factor intensity transition data matrix. At this time, the factor data matrix stored in the factor data storage unit 213 is used. Additionally, the factor intensity transition data matrix is generated by multiplying the measurement data matrix by an inverse matrix of the factor data matrix. Then, the factoring unit 205 transmits the factorization result including the factor data matrix and the factor intensity transition data matrix to the feature generating unit 206.

The processing in step S206 is substantially the same as the prediction model learning process. However, the feature generating unit 206 transmits the extracted feature to the lifetime predicting unit 209.

In step S209, the lifetime predicting unit 209 included in the predicting device 20 calls the prediction model stored in the model storage unit 208 and receives the feature from the feature generating unit 206. Next, the lifetime predicting unit 209 predicts the lifetime characteristics of the prediction target battery by inputting the received feature to the called prediction model. Then, the lifetime predicting unit 209 transmits the prediction value of the lifetime characteristic to the result transmitting unit 212.

In step S210, the model analyzing unit 210 included in the predicting device 20 analyzes the prediction model stored in the model storage unit 208, and obtains the contribution state to the prediction of the lifetime characteristic for each feature. Additionally, the model analyzing unit 210 transmits, to the factor identifying unit 211, the contribution state information including the contribution state for each feature.

The model analyzing unit 210 analyzes the prediction model by, for example, referring to a regression coefficient, analyzing a Shapley value, or the like. By analyzing the prediction model, the contribution state information that is information representing the contribution state to the prediction value is obtained for each feature used for prediction. Since the feature corresponds to each factor, it can be said that the contribution state obtained by the analysis represents the contribution state for each factor. It is desirable that the contribution state includes quantitative information about positive and negative influences given to the prediction value when the feature takes a certain value.

In step S211, the factor identifying unit 211 included in the predicting device 20 receives the contribution state information from the model analyzing unit 210. Next, the factor identifying unit 211 extracts a feature whose contribution state satisfies a predetermined condition based on the received contribution state information. Subsequently, the factor identifying unit 211 identifies a factor corresponding to the extracted feature. Then, the factor identifying unit 211 transmits important factor information related to the identified factor to the result transmitting unit 212. The important factor information includes the extracted feature, the contribution state thereof, and factor data corresponding to the identified factor.

The predetermined condition for the factor identifying unit 211 to extract the feature can be suitably determined as long as the condition is based on the contribution state, for example, whether the contribution state is greater than or equal to a predetermined value, whether the contribution state is less than or equal to a predetermined value, whether the absolute value of the contribution state is greater than a predetermined value, or a predetermined number of states from the top when the contribution states are sorted in descending order.

In step S212, the result transmitting unit 212 included in the predicting device 20 receives the prediction value of the lifetime characteristic from the lifetime predicting unit 209. Additionally, the result transmitting unit 212 receives the important factor information from the factor identifying unit 211. Then, the result transmitting unit 212 transmits the prediction result including the prediction value of the lifetime characteristic and the important factor information to the user terminal 30.

In the user terminal 30, the result output unit 302 receives the prediction result from the predicting device 20. Then, the result output unit 302 outputs the received prediction result to the display device 506 or the like.

Figure 16:
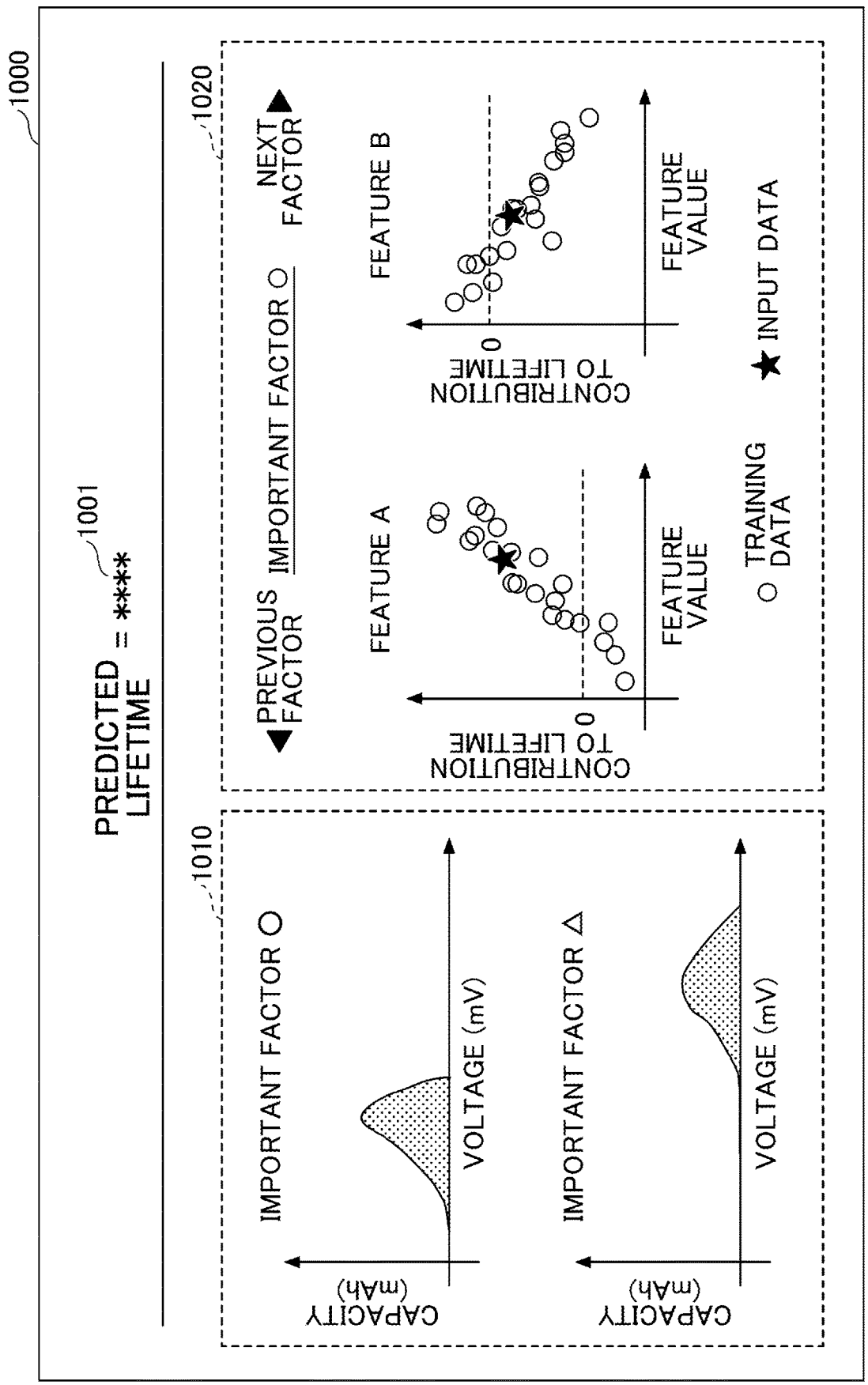
FIG. 16 is a diagram illustrating an example of a prediction result display screen.

FIG. 16 is a diagram illustrating an example of a prediction result display screen for the user terminal 30 displaying the prediction result. As illustrated in FIG. 16, a prediction result display screen 1000 in the present embodiment includes a predicted lifetime display field 1001, an important factor display field 1010, and a contribution state display field 1020. In the predicted lifetime display field 1001, the prediction value of the lifetime characteristic included in the prediction result is displayed. In the important factor display field 1010, the factor data included in the important factor information is displayed in descending order of the contribution state. In the contribution state display field 1020, the contribution state included in the important factor information is displayed.

In the contribution state display field 1020, the feature and the contribution state corresponding to each factor data included in the important factor information are displayed. For example, in the contribution state display field 1020 of FIG. 16, for a feature A and a feature B corresponding to an important factor ○, the plot of a value of the feature and the contribution to the predicted lifetime by taking the value is displayed. In the plot, the training data is indicated by a mark ○ and the prediction target battery is indicated by a mark ★. The plot of the feature A represents a contribution state in which the lifetime becomes longer as the value of the feature increases. With respect to the above, the plot of the feature B represents a contribution state opposite to that of the feature A in which the lifetime becomes shorter as the value of the feature increases.

From the prediction result displayed on the prediction result display screen 1000, the user can obtain, in addition to the prediction value of the lifetime characteristic of the prediction target battery, the factor data related to the factor that affects the prediction result and information indicating how the factor contributes to the prediction result. Because the member of the battery can be identified from the pattern indicated by the factor data, when there is a problem that a predicted cycle lifetime is short or the like, the user can guess a member that causes the problem, and can use a member as a reference to examine an improvement measure.

Effects of Second Embodiment

The battery life predicting system 2 according to the present embodiment predicts the lifetime characteristic of the prediction target battery from the cycle measurement data for prediction, using the prediction model trained by using the cycle measurement data for training. At this time, the battery life predicting system 2 outputs, to the user, the prediction result including the information related to the factor that affects the lifetime characteristic. Therefore, according to the battery life predicting system 2 in the present embodiment, when it is predicted that there is a problem in the lifetime characteristic of the prediction target battery, the user can easily identify the member that affects the lifetime characteristic and can lead to an action for improving the lifetime characteristic.

Particularly, because the battery life predicting system 2 in the present embodiment can predict the lifetime characteristic from the cycle measurement data of the charge and discharge cycle test up to the prediction execution cycle number, the cycle measurement data used for the prediction can be obtained in a short time. Therefore, the time required for analyzing and improving the lifetime characteristic of the prediction target battery can be shortened.

Additionally, the battery life predicting system 2 according to the present embodiment can present the factor data related to the factor that strongly affects the prediction result together with the prediction value of the lifetime characteristic by analyzing the contribution state for each feature from the learned prediction model. Therefore, the user can preferentially examine a member that strongly affects the lifetime characteristic, and can identify the cause at an early stage when there is a problem in the lifetime characteristic.

[Supplement]

In the above-described embodiments, the factoring unit 105 and the factoring unit 205 are examples of a calculating unit. The model analyzing unit 210 is an example of an acquiring unit. The result transmitting unit 106 and the result transmitting unit 212 are examples of an output unit.

Each function in the above-described embodiments can be implemented by one or more processing circuits. Here, the "processing circuit" in the present specification includes a processor with programming to execute each function by software such as a processor implemented by an electronic circuit, and a device such as an application specific integrated circuit (ASIC), a digital signal processor (DSP), a field programmable gate array (FPGA), a conventional circuit module, or the like designed to execute each function described above.

The devices described in the embodiments are merely illustrative of one of multiple computing environments for carrying out the embodiments disclosed herein. In an embodiment, the analyzing device 10 or the predicting device 20 includes multiple computing devices, such as a server cluster. The multiple computing devices are configured to communicate with each other via any type of communication link, including a network, a shared memory, or the like to perform the processes disclosed in the present specification.

Although the embodiments of the present invention have been described in detail above, the present invention is not limited to these embodiments, and various modifications or changes can be made within the scope of the gist of the present invention described in the claims.

The present application claims priority to Japanese Patent Application No. 2021-198746 filed on Dec. 7, 2021 with the Japan Patent Office, the entire contents of which are incorporated herein by reference.

DESCRIPTION OF REFERENCE SYMBOLS 1 battery life analyzing system
2 battery life predicting system
10 analyzing device
20 predicting device
30 user terminal
101, 201 data receiving unit
102, 202 lifetime acquiring unit
103, 203 curve generating unit
104, 204 matrix generating unit
105, 205 factoring unit
206 feature generating unit
207 model training unit
208 model storage unit
209 lifetime predicting unit
210 model analyzing unit
211 factor identifying unit
106, 212 result transmitting unit
213 factor data storage unit
301 data input unit
302 result output unit

The invention claimed is:

1. An analyzing device comprising:
a processor; and
a memory storing program instructions that cause the processor to:
acquire lifetime data from cycle measurement data of a target battery;
calculate, by factoring a relationship between a voltage and a current capacity calculated from the cycle measurement data of the target battery, factor intensity transition data indicating a change in intensity of each factor affecting the current capacity and factor data representing a relationship between a voltage and a current capacity of each factor; and output the lifetime data, the factor data, and the factor intensity transition data.

2. The analyzing device as claimed in claim 1, wherein the relationship between the voltage and the current capacity is calculated based on a QV curve or a dQ/dV curve generated from the cycle measurement data.

3. The analyzing device as claimed in claim 2, wherein the processor performs the factoring by non-negative matrix factorization.

4. A predicting device comprising:
a processor; and
a memory storing program instructions that cause the processor to:
calculate, by factoring a relationship between a voltage and a current capacity calculated from cycle measurement data of a target battery up to a predetermined cycle, factor intensity transition data indicating a change up to the predetermined cycle in intensity of each factor affecting the current capacity;
generate a feature from the factor intensity transition data of each factor; and
predict a lifetime characteristic of the target battery by inputting the generated feature into a model that has learned a relationship between a feature of each factor and lifetime data that are generated based on cycle measurement data for training up to the predetermined cycle.

5. The predicting device as claimed in claim 4, wherein the program instructions further cause the processor to output a prediction value of the lifetime characteristic and factor data representing a relationship between the voltage and the current capacity of a predetermined factor calculated from the cycle measurement data for training.

6. The predicting device as claimed in claim 5, wherein the program instructions further cause the processor to:
acquire a contribution state to the prediction of the lifetime characteristic of the target battery for each generated feature by analyzing the model; and
extract the feature whose contribution state satisfies a predetermined condition from among the generated features to identify a corresponding factor,
wherein the processor outputs the prediction value of the lifetime characteristic of the target battery, the factor data related to the identified factor, and the contribution state corresponding to the identified factor.

7. An analyzing method performed by a computer, comprising:
acquiring lifetime data from cycle measurement data of a target battery;
calculating, by factoring a relationship between a voltage and a current capacity calculated from the cycle measurement data of the target battery, factor intensity transition data indicating a change in intensity of each factor affecting the current capacity and factor data representing a relationship between a voltage and a current capacity of each factor; and
outputting the lifetime data, the factor data, and the factor intensity transition data.

8. A predicting method performed by a computer, comprising:
calculating, by factoring a relationship between a voltage and a current capacity calculated from cycle measurement data of a target battery up to a predetermined cycle, factor intensity transition data indicating a change up to the predetermined cycle in intensity of each factor affecting the current capacity;
generating a feature from the factor intensity transition data of each factor; and
predicting a lifetime characteristic of the target battery by inputting the generated feature into a model that has learned a relationship between a feature of each factor and lifetime data that are generated based on cycle measurement data for training up to the predetermined cycle.

9. A non-transitory computer-readable storage medium having stored therein a program for causing a computer to perform:
acquiring lifetime data from cycle measurement data of a target battery;
calculating, by factoring a relationship between a voltage and a current capacity calculated from the cycle measurement data of the target battery, factor intensity transition data indicating a change in intensity of each factor affecting the current capacity and factor data representing a relationship between a voltage and a current capacity of each factor; and
outputting the lifetime data, the factor data, and the factor intensity transition data.

10. A non-transitory computer-readable storage medium having stored therein a program for causing a computer to perform:
calculating, by factoring a relationship between a voltage and a current capacity calculated from cycle measurement data of a target battery up to a predetermined cycle, factor intensity transition data indicating a change up to the predetermined cycle in intensity of each factor affecting the current capacity;
generating a feature from the factor intensity transition data of each factor; and
predicting a lifetime characteristic of the target battery by inputting the generated feature into a model that has learned a relationship between a feature of each factor and lifetime data that are generated based on cycle measurement data for training up to the predetermined cycle.

* * * * *